(12) United States Patent
Howard et al.

(10) Patent No.: US 8,723,337 B2
(45) Date of Patent: May 13, 2014

(54) STRUCTURE FOR HIGH-SPEED SIGNAL INTEGRITY IN SEMICONDUCTOR PACKAGE WITH SINGLE-METAL-LAYER SUBSTRATE

(75) Inventors: Gregory E. Howard, Plano, TX (US); Matthew D. Romig, Richardson, TX (US); Marie-Solange Anne Milleron, Richardson, TX (US); Souvik Mukherjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 329 days.

(21) Appl. No.: 13/306,486

(22) Filed: Nov. 29, 2011

(65) Prior Publication Data

US 2013/0134579 A1    May 30, 2013

Related U.S. Application Data

(60) Provisional application No. 61/507,870, filed on Jul. 14, 2011.

(51) Int. Cl.
*H01L 23/48*    (2006.01)

(52) U.S. Cl.
USPC ........... 257/784; 257/737; 257/738; 257/698; 257/724; 257/728; 257/E23.04; 361/760; 361/783; 361/777; 174/262

(58) Field of Classification Search
USPC ................. 257/737, 738, 698, 728, 724, 684, 257/E23.04
See application file for complete search history.

(56) References Cited

U.S. PATENT DOCUMENTS

| 6,285,560 | B1 | 9/2001 | Lyne |
| 7,750,465 | B2 | 7/2010 | Hess et al. |
| 2005/0017352 | A1 | 1/2005 | Lee |
| 2008/0023820 | A1 | 1/2008 | Taggart et al. |
| 2008/0073784 | A1 | 3/2008 | Lee |

FOREIGN PATENT DOCUMENTS

KR    100780966 B1    12/2007

*Primary Examiner* — Elias M Ullah
(74) *Attorney, Agent, or Firm* — Steven A. Shaw; Wade James Brady, III; Frederick J. Telecky, Jr.

(57) ABSTRACT

A semiconductor chip (101) with bond pads (110) on a substrate (103) with rows and columns of regularly pitched metal contact pads (131). A zone comprises a first pair (131a, 131b) and a parallel second pair (131c, 131d) of contact pads, and a single contact pad (131e) for ground potential; staggered pairs of stitch pads (133) connected to respective pairs of adjacent contact pads by parallel and equal-length traces (132a, 132b, etc.). Parallel and equal-length bonding wires (120a, 120b, etc.) connect bond pad pairs to stitch pad pairs, forming differential pairs of parallel and equal-length conductor lines. Two differential pairs in parallel and symmetrical position form a transmitter/receiver cell for conducting high-frequency signals.

16 Claims, 4 Drawing Sheets

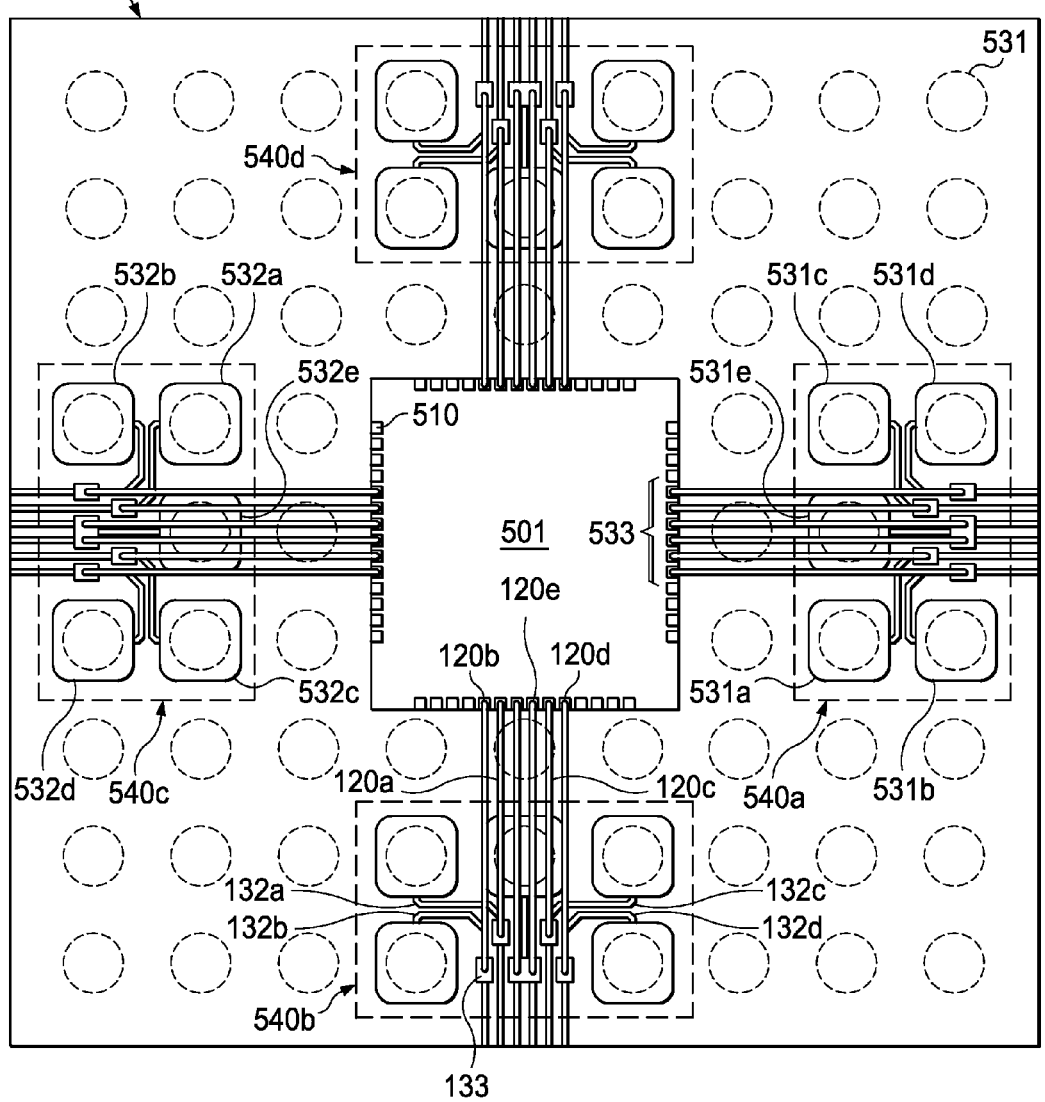

STRUCTURE FOR HIGH-SPEED SIGNAL INTEGRITY IN SEMICONDUCTOR PACKAGE WITH SINGLE-METAL-LAYER SUBSTRATE

FIELD OF THE INVENTION

The present invention is related in general to the field of semiconductor devices and processes and more specifically to configuration and fabrication method of a structure for high-speed signal integrity in semiconductor packages with single-metal-layer substrate and wire bonds.

DESCRIPTION OF RELATED ART

Semiconductor devices typically include an integrated circuit (IC) chip and a substrate integrated with the chip within a package encapsulating the device. In order for a modern semiconductor device to function as intended, it is required that any pair of differential signals that propagates through the device be matched, within prescribed limits, with regard to relative magnitude and relative phase angle of the signal waves.

For the design of an integrated circuit (IC) chip with regard to differential signals, the building blocks may employ circuit components, which have been matched by interdigitating critical layout for components, such as transistors and resistors.

For the design of a substrate or carrier that channels the signals from the IC chip to, for example, a printed circuit board (PCB), the designer often faces similar requirements—there are usually constraints to keep the mismatch of the path of the paired differential signals within limits. As an example, for a 10 GHz signal propagating in a polymer substrate (as is popular in the art), the wavelength is merely about 1.5 cm. For a differential signal pair, it takes only a 0.75 mm mismatch in the total length of the signal path to create a 5% error in the phase angle. The mismatch must involve not only the length of the signal path, which includes the length of metal traces on the substrate and bonding wires that connect the IC chip to the substrate, but also the proximity and the parallelism of the traces and the bonding wires; parallelism and proximity frequently have a 10% mismatch budget. The sum total of these parameters contributing to mismatch is frequently referred to as mismatch budget.

The mismatch budget of the package system involves the aggregate of mismatch of the length, the thickness and the width of the metal traces, the proximity and the parallelism of the traces and the bonding wires, and the diameters and the plated metal thicknesses of the through-holes and vias along the signal path.

In today's technology, the solution to these constraints is the usage of substrates with multiple metal layers. The multiple metal layers provide the flexibility for routing the differential signal pairs from the bond pads of the IC chip with wires to the stitch pads formed by the top level metal of the substrate; this top metal layer also forms the traces that lead the signals to metal-filled via holes, which in turn lead to metal layers beneath the top level. Additional traces can then be formed by metal layers below, which eventually can route the signals to contact pads as the output terminals of the substrate. Often, solder balls or metal studs are affixed to the contact pads and serve as connectors to external circuitry such as printed circuit boards.

SUMMARY OF THE INVENTION

For high-frequency semiconductor devices, applicants recognized as leading market trends the relentless push to ever higher frequencies and the ongoing pressure for lower cost. In view of these trends, applicants saw that the existence of metal-filled vias between the metal multi-layers is severely taxing the mismatch budget of high-speed signal packages. The reasons can be found in the inherent imperfections of the vias: Chances for dimensional mismatch of the signal paths are necessarily increased by the additional drilling of the via holes, the electroplating of the via-hole walls, and the associated manufacturing steps; the unavoidable discontinuities in electrical impedance created by the vias will add to the phase angle mismatch between the signals; and last but not least, multilayered substrates with vias are often prohibitively expensive.

In order to solve the via mismatch problem, applicants choose a substrate with a single metal layer, which avoids the need for via holes altogether. The metal layer is patterned in an array of contact pads sized for solder bumps and an array of stitch pads for wire bonding. With the pad array, zones of pads are selected as the basis for transmitter/receiver cells.

Applicants further recognized that for high frequency operation of a transmitter/receiver cell, the differential pairs need to have tight coupling within the pair, but the differential pairs need to be placed next to one another. This placement causes significant difficulties in achieving acceptably small crosstalk between the differential pairs. Applicants solved the problem of minimizing the cross talk between two tightly spaced differential line pairs by putting a grounded trace and wire bond in between the two pairs.

For wire bonded devices, the tightly packed positioning of differential pairs requires closely spaced stitch pads (landing pads on the substrate to accept the wire bonds from the integrated circuit chip). In order to make space for stitch pads available in a transmitter/receiver unit cell, applicants depopulate one contact pad per 2×3 array, thereby freeing up the space for the stitch pads of two differential pairs placed in tight proximity, and having an additional at least one stitch pad available for a wire at electrical ground potential, placed between the pair as a shield. Enough space in the depopulated area is left to place connecting traces between respective stitch pads and contact pads in the necessary matched fashion for length and parallelism. Care is taken to bond the wires connecting the stitch pads to respective bond pads on the chip surface in parallel and equal-length arches. The resulting differential conductor pairs are matched with regard to length and parallelism in a narrow window.

Furthermore, the differential pairs are noise-shielded by the ground trace or power trace. With these arrangements of a transmitter/receiver cell, high-speed products into the 10 GHz range are enabled with excellent signal integrity.

BRIEF DESCRIPTION OF THE DRAWINGS

FIG. 5 is a top view of an embodiment, a quad duplex high-speed differential transceiver.

It should be noted that FIGS. 1 to 5 are not to scale.

DETAILED DESCRIPTION OF THE PREFERRED EMBODIMENTS

Figure 1:
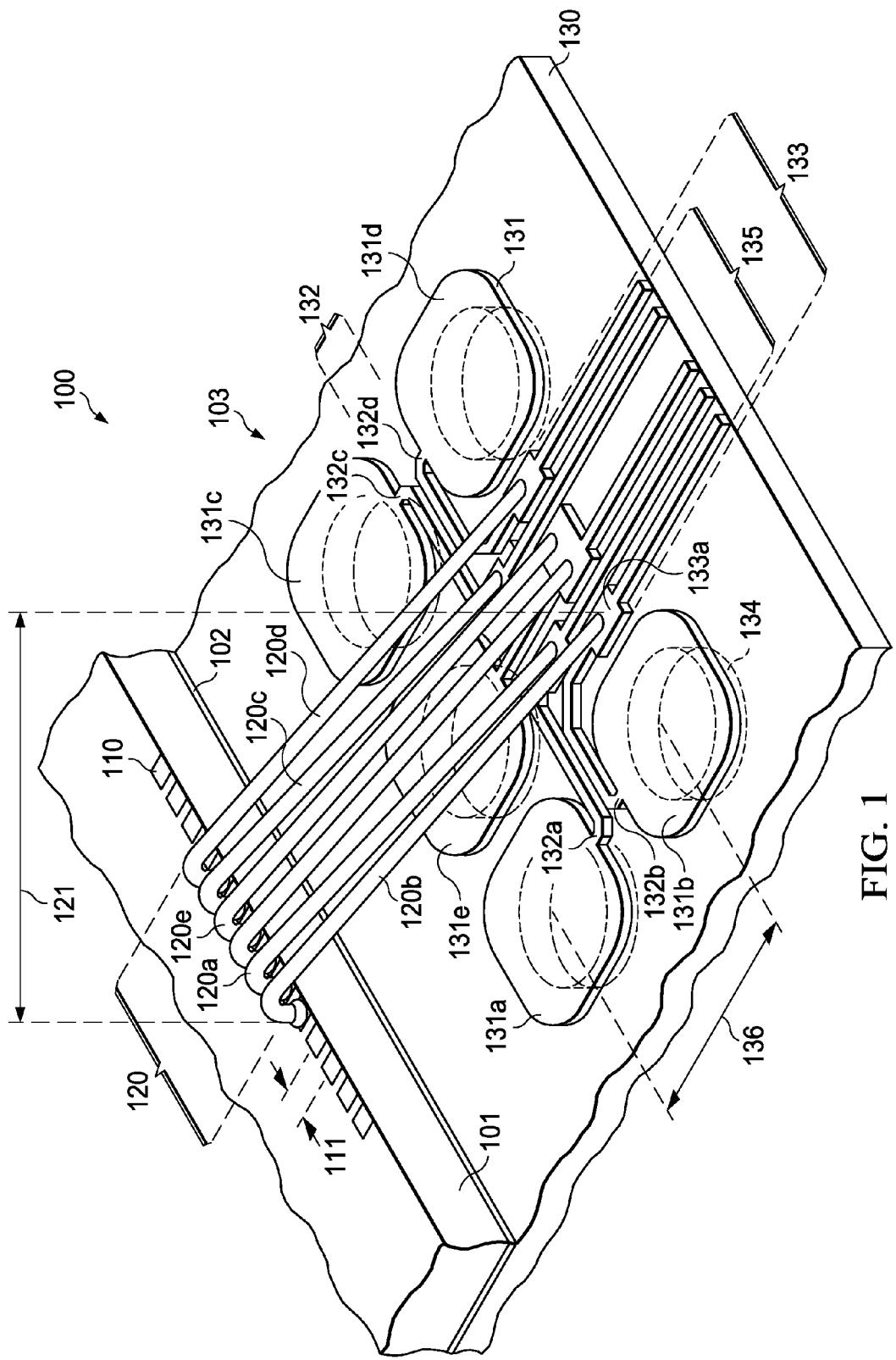
FIG. 1 illustrates a perspective view of a transmitter/receiver cell for conducting high-frequency signals according to an embodiment of the invention.

FIG. 1 illustrates an exemplary transmitter/receiver cell, generally designated 100, for conducting high-frequency signals with integrity in a semiconductor package according to an embodiment of the invention. A semiconductor chip 101 is attached to a substrate 103 by means of an adhesive attachment layer 102 (layer thickness approximately 20 µm). In the example of FIG. 1, the chip may have a thickness of about 280 µm; in other embodiments, the thickness may be greater or smaller.

Located near an edge, chip 101 has a plurality of metal bond pads 110 suitable of affixing bonds of a metal wire. In the example of FIG. 1, an individual wire of the wire plurality 120 may have a diameter between about 20 and 30 µm, which produces a free air ball of about 30 to 50 µm and a squashed ball of about 30 to 60 µm. While bond pads 110 in FIG. 1 are depicted as being arrayed in a linear and orderly row with a pitch center-to-center of about 60 µm, other embodiments may have a staggered array of bond pads, a greater or smaller pitch, bond pads of different areas and outlines other than square, or any other arrangement. The bonds, which may be ball bonds, stitch bonds, or wedge bonds, are shown in FIG. 1 as ball bonds with a wire neck of approximately 100 µm height over the ball.

In the example of FIG. 1, length 121 of a wire is approximately 1000 µm. It should be stressed that the length of all wires 120 shown in FIG. 1 coincides within <5% variation window. In other embodiments, the wire length may be greater or smaller, but the wires have identical lengths within <5% variation window.

As shown in FIG. 1, substrate 103 includes a carrier 130 made of insulating material and a patterned metal layer, which faces chip 101. The insulating carrier material may be provided by a wide spectrum of low-cost materials; as examples, the insulating material may be a tape of polyimide of 50 µm thickness, or a glass-fiber-enhanced plastic board of greater thickness. As an example, the metal of the layer may be copper; a preferred thickness may be in the range from about 10 to 50 µm. The pattern of the metal layer for an exemplary embodiment is shown generally in FIG. 5 and in enlarged detail in FIG. 1. The pattern includes an array of rows and columns of regularly pitched pads 131 with a size suitable for contact pads selected to attach metal bumps such as solder balls; further an array 133 of rows and columns of staggered pads with a size suitable for stitch pads of metal connectors such as bonding wires; and a network of traces generally designated 132 and 135, respectively. Each contact pad 131 may be shaped as a circle or a square or as a square with rounded corners; the diameter of an exemplary contact pad 131 may be 375 µm. In the locations of contact pads 131, the insulating carrier exhibits via-holes 134 with a diameter smaller than the diameter of the contact pads.

Figure 2:
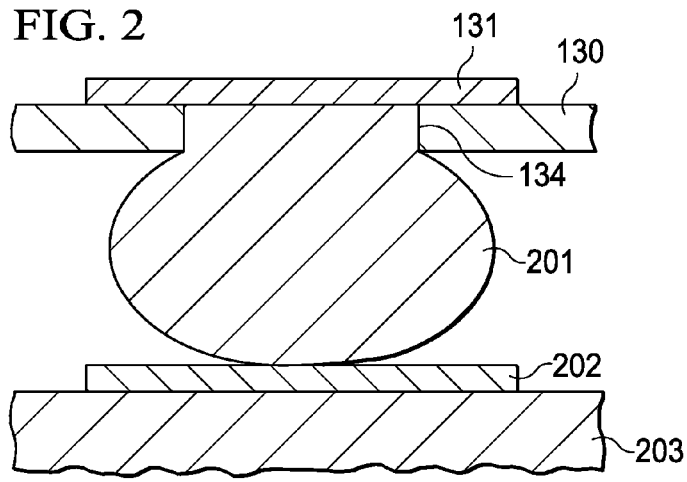
FIG. 2 is a cross section of an individual contact pad with a solder bump attached for contacting an external board.

FIG. 2 shows an example of a solder bump 201 attached to a contact pad 131 by filling via-hole 134 in the insulating carrier 130. The contact pad metal has to overlap the punched hole for the solder bump. The outline of a contact pad may be circular, square, square with rounded corners, hexagonal or any other suitable shape. In a preferred example where contact pad 131 has a width of 375 µm, via-hole 134 may be fabricated by punching a hole of about 300 µm diameter through substrate 134. The size of solder bump 201 is selected to create, after reflow, a reliable connection to metal pad 202 on board 203. As an example, metal pad 202 may be made of copper and has a solderable surface (for instance a nickel layer with an outermost thin gold layer); the size of reflowed solder bump 201 can absorb thermo-mechanical stresses without metal fatigue and cracking.

Referring to FIG. 1, the exemplary transmitter/receiver cell illustrated by the figure is three-dimensional: Bonding wires 120 span the height difference between chip 101 and the surface of substrate 103 with the two-dimensional pattern of the metal layer. It should be pointed out that the short term "cell" is used herein to refer to the electrical unit needed to place two differential pairs of conducting lines side by side for size efficiency purposes; the coupling of signals between differential pairs needs to be ≤1% of the voltage (−40 dB at 5 GHz). Consequently, differential signals exhibit low cross talk between the pairs and within the pairs, and good coupling and length matching, resulting in high frequency signals conducted with good integrity. A differential pair of conducting lines consists of wires, traces, pads and bumps, which together conduct an electrical high frequency signal from one end point to another end point. When one considers a cross section through a differential pair, it has a total current that is substantially zero. The two-dimensional unit of pads and traces needed for the two differential pairs of a cell is herein referred to as a "zone". An example of a zone is discussed in FIG. 1 (the fact that the exemplary zone depicted in FIG. 1 may be only a portion of a larger patterned substrate area surrounding an attached chip is discussed in FIG. 5).

The zone represented in FIG. 1 includes a first pair of contact pads 131a and 131b and a parallel second pair of contact pads 131c and 131d. With the solder bumps attached to each contact pad through the via-holes in carrier 130 supporting the metal pads, the pairs of contact pads provide the input/output terminals for the differential pairs of the cell. In the space between the first and the second pair, a single contact pad 131e is placed. Contact pad 131e is connected to ground potential to provide electrical shielding between the adjacent pairs of contact pads and thus the differential pair of conducting lines.

In the example of FIG. 1, the first pair 131a and 131b and the second pair 131c and 131d of contact pads, together with the single contact pad 131e, form a 2×3 array of contact pads with a regular pitch 136 center-to-center of 500 µm. On the other hand, as the figure suggests, the place for a "partner" of the single contact pad 131e has been depopulated in order to provide the space needed for an array 133 of pads sized as stitch pads and suitable for affixing bonding wires 120.

Figure 3:
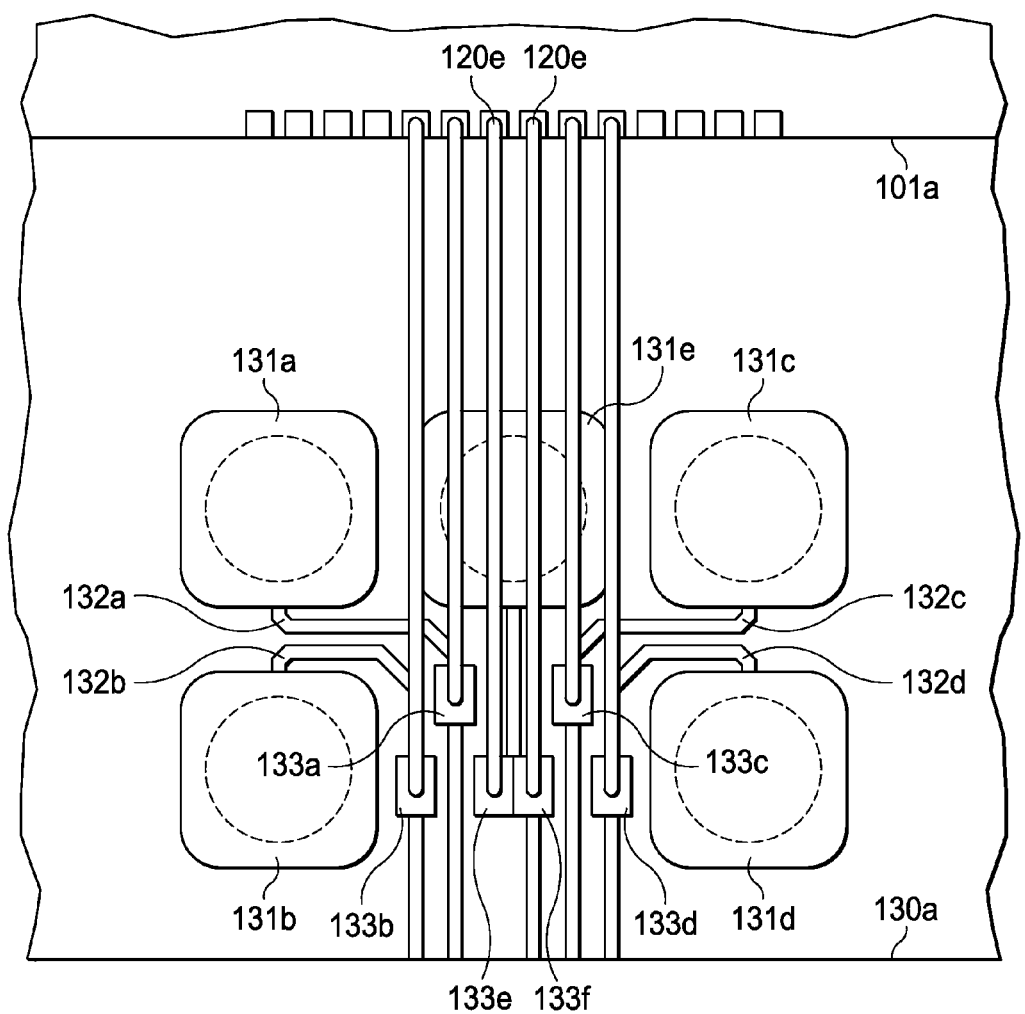
FIG. 3 shows a top view of a substrate zone including contact pads and stitch pads in an arrangement according to the invention.
Figure 4:
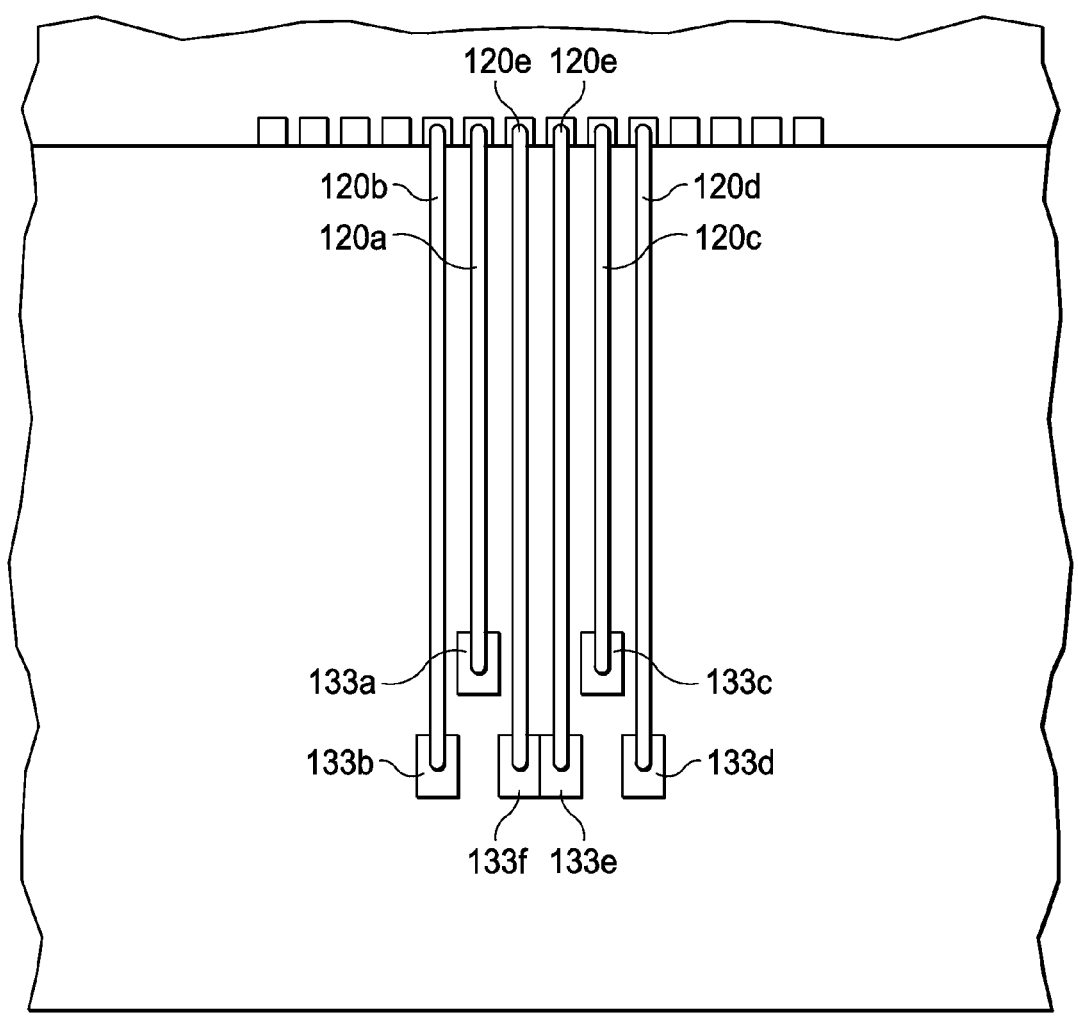
FIG. 4 is a top view of the stitch pads of a substrate zone, the pads including the bonding wires to connect the stitch pads to the chip bonding pads.

The regularity of the array 133 of stitch pads can be seen in FIGS. 3 and 4. FIG. 3 displays in top view the zone of FIG. 1 relative to the chip bond pads; FIG. 4 highlights the stitch pads and the wire bonds connections from chip bond pads to substrate stitch pads. The outline and area of a stitch pad are selected so that the pad provides room for applying a stitch or wedge bond, for instance by means of a capillary, in wire bonding methods (wire diameter about 20 to 30 µm). As an example, a stitch pad may have rectangular shape with side lengths of 100 and 150 µm. As FIG. 3 shows, the array of stitch pads fits in the space between the first and the second pair of contact pads (described above); the space is equivalent to depopulating a contact pad space as illustrated in the figures. In the example, the zone comprises five adjacent contact pads surrounding one site where a would-be contact pad is vacated. The five contact pads form a U-shape with the opening of the U facing the edge 130a of the substrate, away from the bond pads. In other embodiments, the bond pads may be arranged in mirror image, the U-shape opening facing the edge 101a of the chip. The stitch pads are patterned in two rows of unequal numbers; in the example shown in FIG. 3, the longer row has four stitch pads, the shorter row has two stitch pads, which are arranged in staggered position relative to the longer row. The first pair of stitch pads is designated 133a and 133b in the figures. An analogous staggered position applies to stitch pads 133c and 133d.

Adjacent stitch pads of parallel rows are in staggered arrangement, because staggering allows the attached bonding wires to be spanned in parallel and in tight proximity between respective bond pads and stitch pads, for instance with only 60 μm spacing. The pair of bonding wires for stitch pads 133a and 133b is designated 120a and 120b, respectively, in FIGS. 1 and 4; in analogous fashion, the pair of bonding wires for stitch pads 133c and 133d is designated 120c and 120d, respectively. In other embodiments, the spacing may be greater, such as 150 μm. The staggered position of stitch pads 133a and 133b relative to each other allows the differential pair of respective bonding wires 120a and 120b to stay within 5° of parallelism relative to each other. An analogous correlation holds for stitch pads 133c and 133d and their respective bonding wires.

Stitch pads and contact pads need to be connected by conductive traces; preferably, these traces are fabricated by etching from the same metal layer 131 on the surface of insulating carrier 130. The width of the traces is dependent on the aspect ratio with the layer thickness; as an example, the traces may have a width of about 20 μm. FIG. 3 shows the pairs of traces connecting respective stitch pads and adjacent contact pads. As an example, trace 132a, connecting stitch pad 133a with adjacent contact pad 131a, and trace 132b, connecting stitch pad 133b with adjacent contact pad 131b, form a pair of traces laid out substantially parallel and of equal length. Symmetrical to the pair of traces 132a and 132b is the pair of traces 132c and 132d, which connects in substantially parallel and equal-length manner to the pair of contact pads 131c and 131d, respectively.

As FIG. 3 shows, the array of staggered stitch pads has stitch pads 133e and 133f in a symmetrical center position between pair 133a and 133b and pair 133c and 133d. In some embodiments, stitch pads 133e and 133f may be combined into a single pad of larger area than other stitch pads. Stitch pads 133e and 133f are connected to contact pad 131e, which is at ground potential. The one or two bonding wires 120e, which connect stitch pads 113e and 133f to respective bond pads at the chip edge, are parallel with and equidistant to the other bonding wires. As a consequence, the ground potential of stitch pads 133e and 133f and bonding wires 120e help to provide an effective shield for low cross talk between the conducting lines of differential pair 120a-133a-132a-131a and 120b-133b-132b-131b and differential pair 120c-133c-132c-131c and 120d-133d-132d-131d. The cited differential pairs consist of two substantially parallel and equal-length conductor portions able to conduct, with high integrity, a high frequency signal from a package terminal (solder bump) to a chip terminal and vice versa. As mentioned, when one considers a cross section through a differential pair, it has a total electrical current that is substantially zero.

As mentioned, the purpose of a high-integrity signal transfer can be achieved, whether the opening of the U-shape of the contact pad array faces towards the chip edge, as shown in FIG. 3, or faces away from the chip edge.

Referring to FIG. 1, traces designated 135 lead from the stitch pads to the edge of the substrate. These traces serve the purpose to connect the patterned metal layer to the plating bar for temporarily hooking the chip to a plating bath in order to deposit additional metal onto the traces at low cost.

For protection of the bonding wires and the chip surface, the chip has to be encapsulated, preferably in molding compound. In a preferred example, the thickness of the molding compound over the peak of the bonding wire arch may be between 300 and 400 μm.

The exemplary embodiment described in FIGS. 1, 2, 3, and 4 illustrates that the requirement of keeping the integrity of the differential signals to within 5% of the mismatch budget and within 10% of the differential impedance budget can be achieved without the conventional multiple metal layered substrates and associated metal-filled via-holes. Using a single metal-layered substrate, the patterned metal layer includes a zone that can accommodate the bond stitch pads in a staggered fashion. Traces from adjacent stitch pads to the respective contact pads run in mostly parallel fashion. For the three-dimensional cell associated with the zone, the contact pads of a differential pair are placed so that the sum of the bonding wires and the traces for the differential pair are of comparable length.

The resultant cell is able to stay well within the 5% mismatch budget and 10% proximity and parallelism budget that ensures the signal integrity of the semiconductor package. The required impedance match is around 100Ω for the differential impedance. The design requirements force a ground reference to be carried with each of the signals. The preferred impedance to ground is around 50Ω for each of the traces in the differential pairs; each differential pair consists of a positive-going voltage and a negative-going voltage when referenced to this ground. The impedance of these voltages to this reference ground is preferably about 50Ω for both the positive-going signal and the negative-going signal.

The frequency range of the high-speed signal device is preferably about 5 to 10 GHz; at 10 GHz, the wavelength is in air 30 mm and in molding compound about 15 mm. At 10 GHz, the impedance match is preferably within 15%, more preferably within 10%. The preferred voltage range of the device is about 800 to 1000 mV, with a current of around 10 mA per differential pair, assuming a 100Ω load. For a 1000 mV input differential signal, the crosstalk between differential pairs is preferably kept to lower than 10 mV (or −40 dB at 5 GHz). For the exemplary embodiment discussed above, the crosstalk has been measured to be around 3 mV.

The concept of a transmitter/receiver cell with two differential pairs of conductor lines in parallel and symmetrical position can be expanded to system, wherein a chip is assembled on a substrate with several such cells surrounding the chip. In a preferred arrangement, four transmitter/receiver cells surround a chip in a cross-wise arrangement.

Another exemplary embodiment is shown in FIG. 5 as a quad duplex high-speed differential transceiver. It should be noted that, for reasons of clarity, FIG. 5 depicts a simplified X-ray figure; it shows only selected pads, traces and bonding wires. FIG. 5 illustrates in a top view of a square (or rectangular) semiconductor chip 501 with bond pads 510 near the chip edges; the view penetrates an encapsulation compound in X-ray fashion. The chip is assembled on a substrate 503, which has a metal layer facing the chip. The layer includes a patterned of an array of rows and columns of regularly pitched pads 531, sized as contact pads. Within the array, four transmitter/receiver cells are outlined in FIG. 5 by dashed contours 540a, 540b, 540c, and 540d; the cells are designed according to the invention to conduct high-frequency signals with integrity.

The cells are positioned symmetrically at the four sides of the chip. Each cell comprises a first pair (531a, 531b) and a parallel second pair (531c, 531d) of contact pads, and, in the space between the first and the second pair, a single contact pad (531e) for ground potential and staggered pairs of pads (133) sized as stitch pads. Each stitch pad pair is connected to a respective adjacent contact pad pair by parallel and equal-length traces (132a and 132b, 132c and 132d).

Bonding wires (120a and 120b, 120c and 120d) spanning parallel and equal-length arches for connecting a pair of bond pads to a respective pair of stitch pads. The sum of bond pad, wire, stitch pad, trace and contact pad forms a conductor line, and a pair of parallel and equal-length conductor lines forms a differential pair from bond pad to contact pad. For a differential pair, the lengths of the conductor lines agree within 5% and the bonding wires are within 5% of parallelism. In this context, the direction of the bonding wires may form a normal angle with the respective chip side, or the direction of the bonding wires may form an angle slightly off from normal with the respective chip side. Two differential pairs of conductor lines in parallel and symmetrical position form a transmitter/receiver cell for conducting high-frequency signals with integrity.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to integrated circuits, but also other devices for high-speed electrical signals.

As another example, this invention applies to devices where the substrate is made using other stackups, material, or methods, which substantially achieve an interconnect between the IC chip and the PBC using the techniques described herein—for example, to devices where the patterned conducting layer is applied by plating, printing, or etching, or where the insulating layer is composed of a cured epoxy material such as a molding compound, or where the interconnect through the insulating layer is composed of substantially small vias filled with copper, solder, or other conductive materials.

As another example, the invention applies to devices encapsulated by molding compound and by other protective packages such as a metal can.

It is therefore intended that the appended claims encompass any such modifications or embodiments.

We claim:

1. A semiconductor device for high-speed electrical signals, comprising:
   a semiconductor chip having bond pads near a chip edge, the chip assembled on a substrate;
   the substrate having a metal layer facing the chip, the layer patterned in an array including rows and columns of regularly pitched pads sized as contact pads;
   a zone within the array comprising a first pair and a parallel second pair of contact pads, and, in a space between the first and the second pair, a single contact pad for ground potential and staggered pairs of pads sized as stitch pads, each stitch pad pair connected to a respective adjacent contact pad pair by parallel and equal-length traces;
   bonding wires spanning parallel and equal-length arches for connecting a pair of bond pads to a respective pair of stitch pads, thus forming a differential pair of parallel and equal-length conductor lines from bond pad to contact pad;
   two differential pairs of conductor lines in parallel and symmetrical position, the two differential pairs forming a transmitter/receiver cell for conducting high-frequency signals with integrity.

2. The device of claim 1 further including solder bumps attached to the contact pad surfaces remote from the chip.

3. The device of claim 2 wherein the sum of conductors forming one of the conductor lines in a differential pair agrees within 5% with the sum of conductors forming the other conductor line of the pair.

4. The device of claim 3 wherein the bonding wires of the two conductor lines forming a differential pair are within 100 μm spacing from each other across their entire length.

5. The device of claim 4 wherein the bonding wires of the two conductor lines forming a differential pair are within 5° of parallelism with respect to each other.

6. The device of claim 5 wherein the coupling of signals between two differential pairs ≤1% of the voltage, corresponding to −40 dB at 5 GHz.

7. The device of claim 1 wherein the substrate has a metal layer facing the external contact pads.

8. The device of claim 1 wherein the substrate has a pattern created by plating or etching of the conductive layer.

9. The device of claim 1 wherein an insulating layer on the substrate is selected from a group including polyimide, glass-fiber-reinforced plastic, or epoxy molding compound.

10. The device of claim 1 wherein the contact pad surfaces remote from the chip are solderable and selected from a group including NiPdAu, copper-OSP, or tin or tin-based alloy.

11. A semiconductor device for high-speed electrical signals, comprising:
    a semiconductor chip having bond pads near a chip edge, the chip assembled on a substrate;
    the substrate having a metal layer facing the chip, the layer patterned in an array including rows and columns of regularly pitched pads sized as contact pads;
    four zones within the array, each zone comprising a first pair and a parallel second pair of contact pads, and, in a space between the first and the second pair, a single contact pad for ground potential and staggered pairs of pads sized as stitch pads, each stitch pad pair connected to a respective adjacent contact pad pair by parallel and equal-length traces, the zones positioned symmetrically around the chip perimeter with one zone each at each chip side;
    at each chip side, bonding wires spanning parallel and equal-length arches for connecting a pair of bond pads to a respective pair of stitch pads, thus forming a differential pair of parallel and equal-length conductor lines from bond pad to contact pad;
    two differential pairs of conductor lines in parallel and symmetrical position, the two differential pairs forming a transmitter/receiver cell for conducting high-frequency signals with integrity, four cells positioned symmetrically around the chip perimeter with one cell each at each chip side.

12. The device of claim 11 further including solder bumps attached to the contact pad surfaces remote from the chip.

13. The device of claim 12 wherein in each cell the sum of conductors forming one of the conductor lines in a differential pair agrees within 5% with the sum of conductors forming the other conductor line of the pair.

14. The device of claim 13 wherein in each cell the bonding wires of two conductor lines forming a differential pair are within 100 μm spacing from each other across their entire length.

15. The device of claim 14 wherein in each cell bonding wires of the two conductor lines forming a differential pair are within 5° of parallelism with respect to each other.

16. The device of claim 15 wherein in each cell the coupling of signals between two differential pairs ≤1% of the voltage, corresponding to −40 dB.

* * * * *